United States Patent [19]

Matsushita

[11] Patent Number: 5,424,675
[45] Date of Patent: Jun. 13, 1995

[54] FULL DIFFERENTIAL TYPE ANALOG CIRCUIT HAVING PARALLEL OPPOSITELY CONNECTED CAPACITORS TO ELIMINATE UNBALANCED PARASITIC CAPACITANCES

[75] Inventor: Hiroshi Matsushita, Tokyo, Japan

[73] Assignee: NEC Corporation, Tokyo, Japan

[21] Appl. No.: 66,492

[22] Filed: May 14, 1993

[30] Foreign Application Priority Data

May 29, 1992 [JP] Japan ................................. 4-163657

[51] Int. Cl.⁶ ............................................. H03F 3/45
[52] U.S. Cl. .................................... 327/558; 327/563; 330/294
[58] Field of Search ............... 327/494, 521, 520, 490, 327/167, 162, 563, 552, 558, 344; 330/300, 107, 109, 306, 294; 257/306, 296, 532, 533

[56] References Cited

U.S. PATENT DOCUMENTS

| | | | |
|---|---|---|---|
| 4,626,881 | 12/1986 | Kishi et al. | 257/532 |
| 5,117,205 | 5/1992 | Nauta | 302/521 |
| 5,283,483 | 2/1994 | Laber et al. | 302/494 |

FOREIGN PATENT DOCUMENTS 4371006 12/1992 Japan .................................. 302/494

Primary Examiner—Timothy P. Callahan
Assistant Examiner—Dinh T. Le
Attorney, Agent, or Firm—Whitham, Curtis, Whitham & McGinn

[57] ABSTRACT

A full differential type analog circuit includes a full differential type operational amplifier, a first network, a second network, and a third network. The full differential type operational amplifier has inverting and non-inverting input terminals and inverting and non-inverting output terminals. The first network is connected between the inverting input terminal and the non-inverting output terminal and has a first input terminal for inputting a signal to the inverting input terminal and a first output terminal connected to the non-inverting output terminal. The second network is connected between the non-inverting input terminal and the inverting output terminal and has a second input terminal for inputting a signal to the non-inverting input terminal and a second output terminal connected to the inverting output terminal. The third network is connected between the first and second networks and includes two capacitors having the same arrangements, each formed by parallelly connecting an upper capacitor electrode and a lower capacitor electrode formed on a semiconductor substrate in opposite directions.

1 Claim, 3 Drawing Sheets

FULL DIFFERENTIAL TYPE ANALOG CIRCUIT HAVING PARALLEL OPPOSITELY CONNECTED CAPACITORS TO ELIMINATE UNBALANCED PARASITIC CAPACITANCES

BACKGROUND OF THE INVENTION

The present invention relates to an analog circuit constituted by an operational amplifier, resistors, and capacitors and, more particularly, to an analog circuit having a full differential arrangement arranged on a semiconductor substrate.

A differential type analog circuit of this type is used in an active filter or the like. For example, in the analog interface unit of A/D and D/A converters for converting an analog signal to a digital signal and converting a digital signal to an analog signal, a low-pass active filter of this type is used as a pre-filter used for reducing a folded signal normally generated at about a sampling frequency on the A/D converter side, or as a post-filter used for reducing out-band quantization noise or video noise generated on the D/A converter side.

FIG. 4 shows a conventional low-pass active filter. Referring to FIG. 4, reference number $1a$ denotes an operational amplifier; $C_{14}$ and $C_2$, capacitors; and $R_1$ and $R_2$, resistors.

Assuming that the operational amplifier $1a$ has ideal characteristics, an output voltage generated at an output terminal OUT with respect to an input voltage Vi applied to an input terminal IN is represented by Vo, and the capacitance of the capacitor $C_{14}$ is represented by $4C_1$. At this time, a transfer function of the input and output voltages Vi and Vo can be given by equation (1).

$$Vo/Vi = -1/\{4R_1R_2C_1C_2s^2 + (2R_1C_2 + R_2C_2)s + 1\} \quad (1)$$

When the low-pass active filter shown in FIG. 4 is realized on a semiconductor substrate to achieve the above-mentioned object, the following problems are posed. That is, a power-supply voltage variation elimination ratio is low, and when a semiconductor substrate voltage varies, an output from the low-pass active filter varies due to capacitive coupling.

As a conventional method of solving the above problems to reduce noise, the following method has been used. That is, the above single-output type low-pass filter is changed into a full differential type filter by using a differential output type operational amplifier.

FIG. 5 shows a filter circuit obtained by changing the low-pass active filter shown in FIG. 4 into a full differential filter.

This circuit is constituted by: a differential output type operational amplifier 1; a first network A connected between the inverting input terminal and non-inverting output terminal of the operational amplifier 1 and constituted by a capacitor $C_2$ and resistors $R_1$ and $R_2$; a second network B connected between the non-inverting input terminal and inverting output terminal of the operational amplifier 1 and constituted by a capacitor $C_2$ and resistors $R_1$ and $R_2$; and a third network C constituted by a single capacitor $C_{12}$ for connecting the first network A to the second network B.

In the circuit in FIG. 5, when the capacitance of the capacitor $C_{12}$ is set to be $2C_1$, the transfer function of the circuit at input terminals $IN_1$ and $IN_2$ and output terminals $OUT_1$ and $OUT_2$ is given by equation (1).

When the full differential type analog circuit arranged as described above is employed, a transfer function from a power supply line or the semiconductor substrate to the non-inverting output terminal is equal to that from the power supply line to the inverting output terminal, the outputs from the non-inverter and inverting output terminals cancel out, and the variation in output detected in a single-output arrangement does not occur.

Therefore, noise can be reduced by 40 to 60 dB when the full differential type analog circuit is used compared with the single-output arrangement.

Conventionally, in a full differential type analog circuit manufactured on a semiconductor substrate, a capacitor, as shown in FIG. 6A, is arranged on a semiconductor substrate 2 such that an insulating film 5 is inserted between a lower capacitor electrode 3 and an upper capacitor electrode 4.

In this case, parasitic capacitances viewed from both the upper capacitor electrode 4 side and the lower capacitor electrode 3 side will be considered. Assuming that the capacitance of this capacitor is set to be $C_1$, a parasitic capacitance 6 shown in FIG. 6B and generated between the lower capacitor electrode 3 and the semiconductor substrate 2 is about $C_1/10$, and a parasitic capacitance generated between the upper capacitor electrode 4 and the semiconductor substrate 2 can be neglected compared with the parasitic capacitance between the lower capacitor electrode 3 and the semiconductor substrate 2.

This difference between the parasitic capacitances, in the full differential type low-pass filter shown in FIG. 5, causes a difference between influences of the semiconductor substrate 2 on the transfer functions of a non-inverting output and an inverting output, thereby occurring a variation in differential voltage.

SUMMARY OF THE INVENTION

It is an object of the present invention to provide a full differential type analog circuit capable of obtaining an accurate differential balance.

It is another object of the present invention to provide a full differential type analog circuit capable of preventing a variation in differential voltage caused by a parasitic capacitance of a capacitor.

In order to achieve the above objects, according to the present invention, there is provided a full differential type analog circuit comprising a full differential type operational amplifier having inverting and non-inverting input terminals and inverting and non-inverting output terminals, a first network connected between the inverting input terminal and the non-inverting output terminal and having a first input terminal for inputting a signal to the inverting input terminal and a first output terminal connected to the non-inverting output terminal, a second network connected between the non-inverting input terminal and the inverting output terminal and having a second input terminal for inputting a signal to the non-inverting input terminal and a second output terminal connected to the inverting output terminal, and a third network connected between the first and second networks and including two capacitors having the same arrangements, each formed by parallelly connecting an upper capacitor electrode and a lower capacitor electrode formed on a semiconductor substrate in opposite directions.

DESCRIPTION OF THE PREFERRED EMBODIMENTS

Embodiments of the present invention will be described below with reference to the accompanying drawings.

Figure 1:
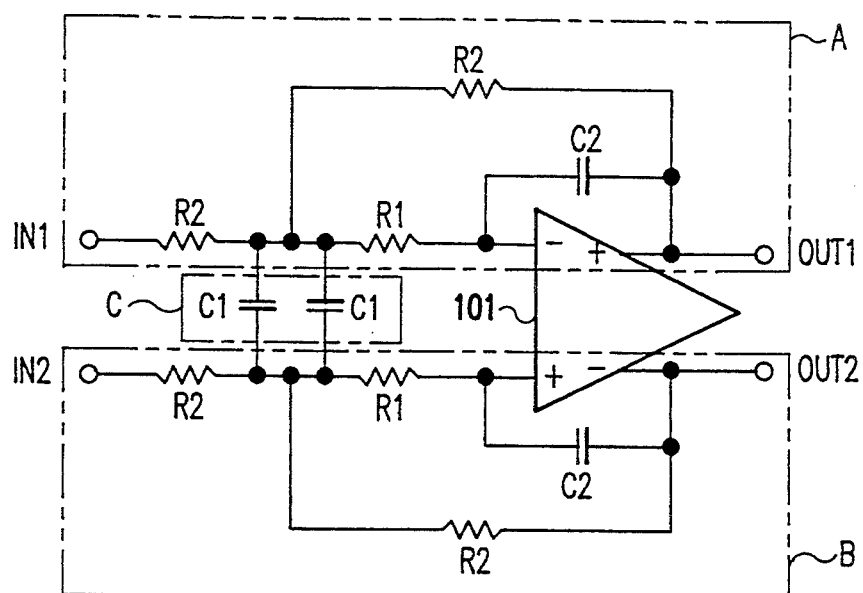
FIG. 1 is a circuit diagram showing a full differential type analog circuit according to the first embodiment of the present invention.

FIG. 1 shows the first embodiment of the present invention. As shown in FIG. 1, a circuit according to this embodiment is constituted by a full differential type operational amplifier 101, two resistors $R_1$, four resistors $R_2$, two capacitors $C_1$, and two capacitors $C_2$. That is, the resistors $R_1$ and $R_2$ are connected in series with the inverting input terminal of the operational amplifier 101, the resistors $R_2$ is connected between the non-inverting output terminal of the operational amplifier 101 and the connection point between the series-connected resistors $R_1$ and $R_2$, and the capacitor $C_2$ is connected between the non-inverting output terminal and inverting input terminal of the operational amplifier 101. On the other hand, the resistors $R_1$ and $R_2$ are connected in series with the non-inverting input terminal of the operational amplifier 101, the resistor $R_2$ is connected between the inverting output terminal of the operational amplifier 101 and the connection point between the series-connected resistors $R_1$ and $R_2$, the capacitor $C_2$ is connected between the inverting output terminal and non-inverting input terminal of the operational amplifier 101. The two capacitors $C_1$, $C_1$ are connected between the connection points of the resistors $R_1$ and $R_2$ connected in series with the inverting and non-inverting output terminals of the operational amplifier 101, respectively. Note that the resistors and capacitors by which the same reference numerals are denoted have the same resistances and capacitances, respectively.

The resistors and capacitors constitute a first network A comprising an input terminal $IN_1$ and an output terminal $OUT_1$ and connected to the inverting input terminal and non-inverting output terminal of the operational amplifier 101, a second network B comprising an input terminal $IN_2$ and an output terminal $OUT_2$ and connected to the non-inverting input terminal and inverting output terminal of the operational amplifier 101, and a third circuit network C for connecting the first network A to the second network B.

Figure 3A:
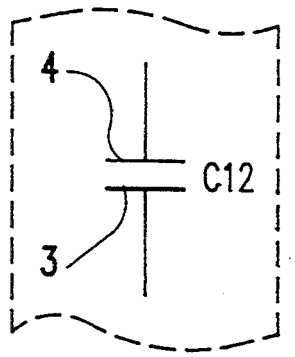
FIG. 3A is a circuit diagram showing a conventional third network.
Figure 3B:
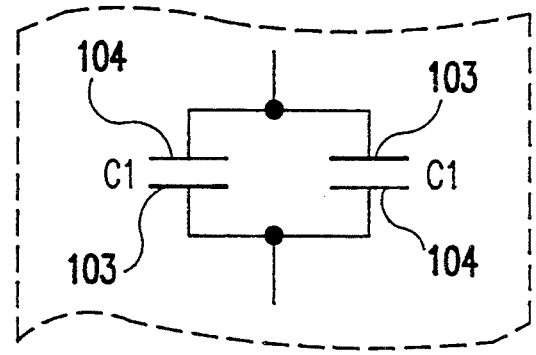
FIG. 3B is a circuit diagram showing a third network according to the second embodiment of the present invention.
Figure 4:
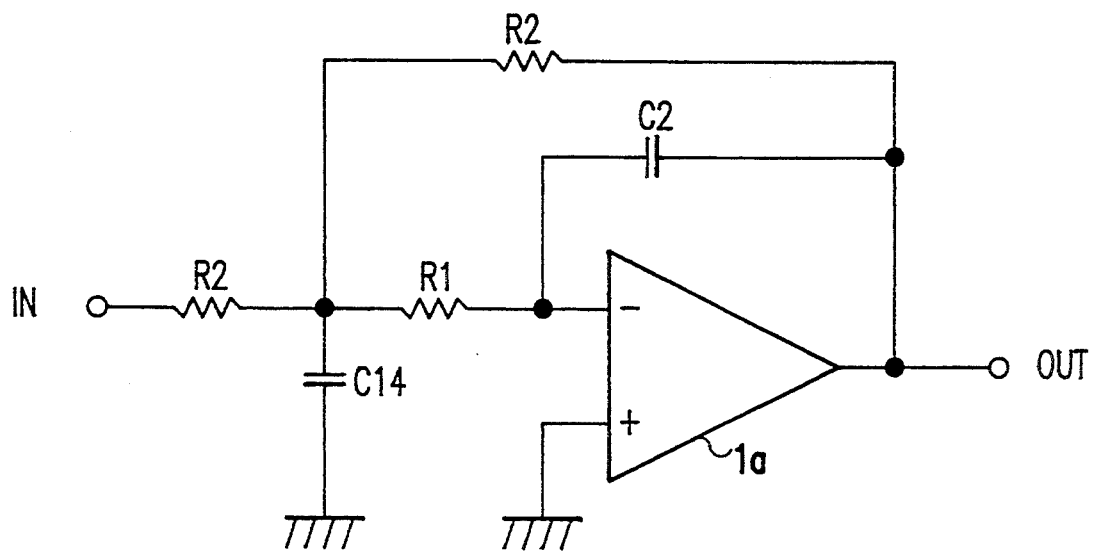
FIG. 4 is a circuit diagram showing a conventional low-pass active filter.
Figure 5:
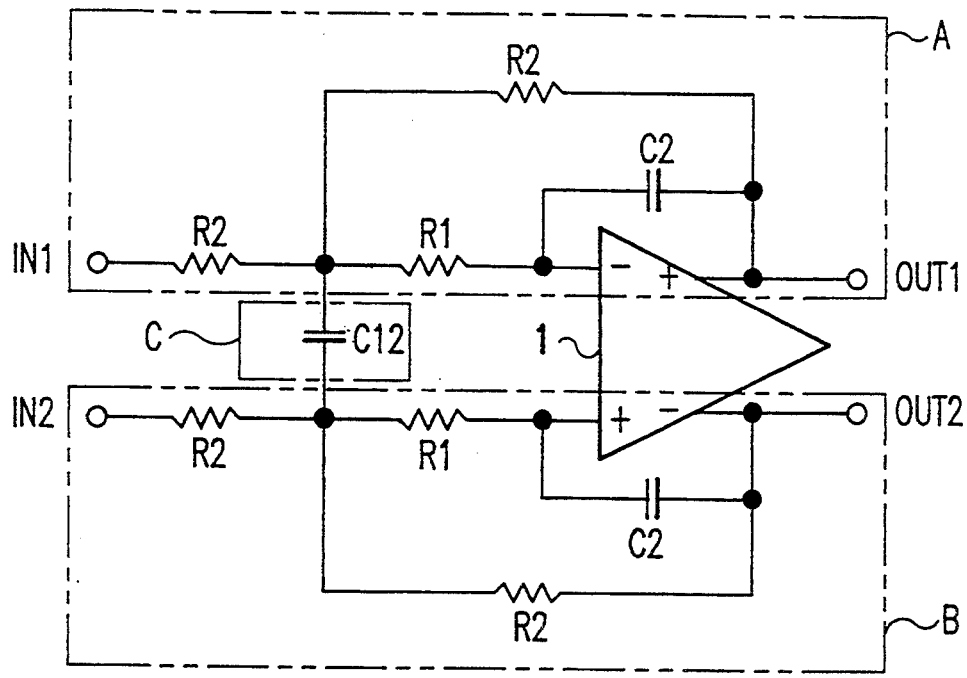
FIG. 5 is a circuit diagram showing another conventional low-pass active filter.
Figure 6A:
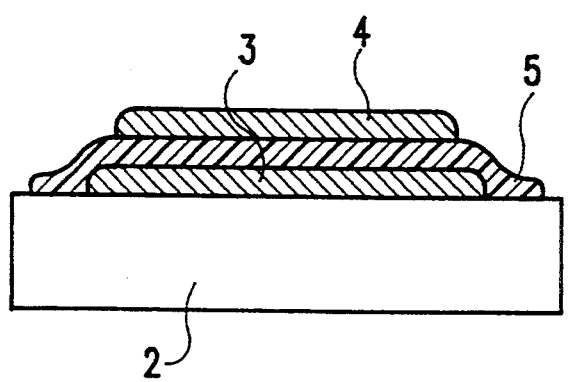
FIG. 6A is a sectional view showing a capacitor used in a full differential type analog circuit.
Figure 6B:
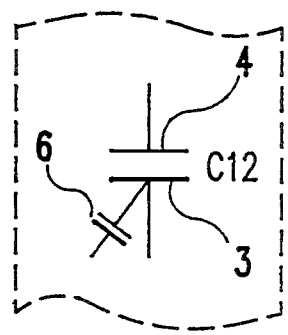
FIG. 6B is an equivalent circuit diagram showing the capacitor in FIG. 6A.

The capacitor constituting the third network C is constituted by an inverse-parallel-connected circuit consisting of the two capacitors $C_1$ having the same arrangements in place of the conventional single-arrangement element $C_{12}$ (FIG. 3A) having a pair of lower capacitor electrode 3 and upper capacitor electrode 4. That is, as shown in FIG. 3B, an upper capacitor electrode 104 of one of the pair of capacitors $C_1$ is connected to the first network A, and a lower capacitor electrode 103 of the corresponding capacitor is connected to the second network B. An upper capacitor electrode 104 of the other of the pair of capacitors $C_1$ is connected to the second network B, and a lower capacitor electrode 103 of the corresponding capacitor is connected to the first network A. At this time, the relationship between the capacitor $C_{12}$ shown in FIG. 3A and the capacitor $C_1$ shown in FIG. 3B preferably satisfies $C_{12} = 2C_1$.

This full differential type analog circuit constitutes a full differential type low-pass active filter, and generates an output signal Vo which passes or is filtered in accordance with an input voltage Vi.

The transfer function of the input and output voltages is given by equation (2) by using the operational amplifier 101 as an ideal circuit.

$$Vo/Vi = -1\{4R_1R_2C_1C_2s^2 + (2R_1C_2 + R_2C_2)s + 1\} \qquad (2)$$

In this case, parasitic capacitances in the two capacitors $C_1$ constituting the third network C will be considered. Although a parasitic capacitance generated between the lower capacitor electrode 103 of the capacitor $C_1$ and a semiconductor substrate is about $C_1/10$, a parasitic capacitance generated between the upper capacitor electrode 104 of the capacitor $C_1$ and the semiconductor substrate can be neglected compared with the parasitic capacitance between the lower capacitor electrode 103 and the semiconductor substrate. The two parasitic capacitances are similarly generated by the two capacitors $C_1$. Therefore, in the third network C as a whole, the parasitic capacitances in the two capacitors $C_1$ similarly act on a transfer function on the inverting output side and a transfer function on the non-inverting output side. As a result, a variation in differential voltage caused by the above-mentioned difference between parasitic capacitances as a conventional problem does not occur, and the full differential type analog circuit can have an excellent differential balance.

Figure 2:
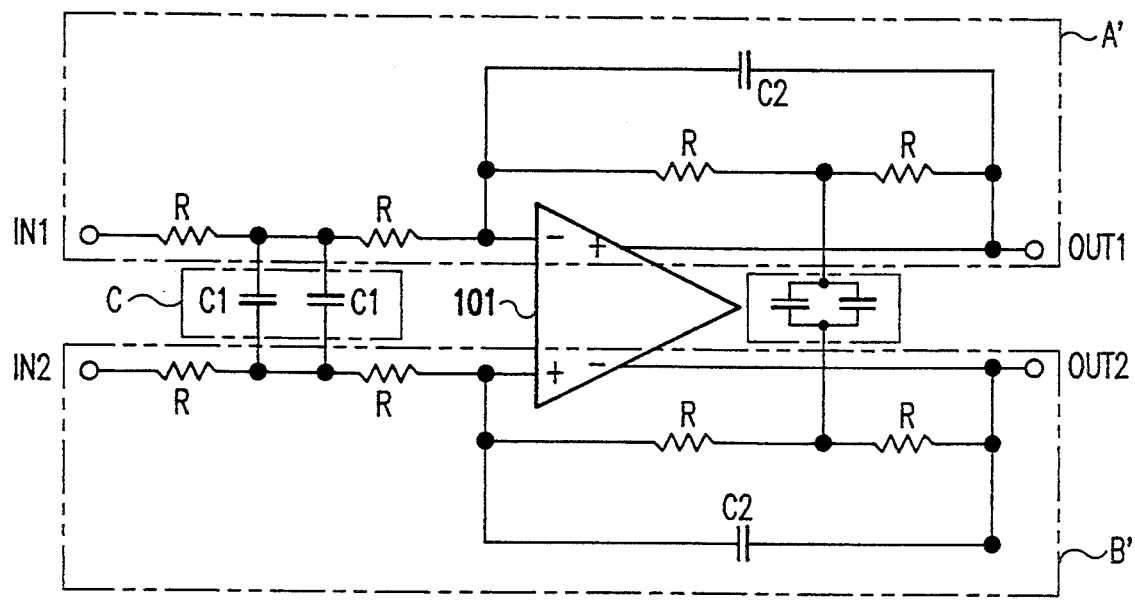
FIG. 2 is a circuit diagram showing a full differential type analog circuit according to the second embodiment of the present invention.

FIG. 2 shows the second embodiment of the present invention.

In this embodiment, there are provided two third networks C for connecting a first network A' and a second network B'. That is, according to this embodiment, unlike the first embodiment, each of feedback resistors connected parallelly to two capacitors $C_2$ of the first and second networks A' and B' is constituted by a series-connected circuit consisting of two resistors R, and another third network C is connected between the connection point of the resistors R in the first network A' and the connection point of the resistors R in the second network B'. Each of the third networks is constituted by an inverse-parallel-connected circuit consisting of two capacitors $C_1$ having the same arrangements, and therefore the circuit of this embodiment has the same effect as in the first embodiment.

As has been described above, in a full differential type analog circuit according to the present invention, the third network for connecting the first network connected to the inverting input terminal and non-inverting output terminal of an operational amplifier and the second network connected to the non-inverting input terminal and inverting output terminal of the operational amplifier is constituted by an inverse-parallel-connected circuit consisting of two capacitors having the same arrangements. According to the present invention, an influence of a parasitic capacitor on a transfer function of an inverting output and an influence of a parasitic capacitor on a transfer function of a non-inverting output can cancel out. Therefore, according to the present invention, a variation in differential voltage caused by a parasitic capacitor as a conventional problem can be prevented, and the full differential type analog circuit can have an accurate differential balance.

What is claimed is:

1. A full differential type analog circuit formed on a substrate, comprising:
   a full differential type operational amplifier having inverting and non-inverting input terminals and inverting and non-inverting output terminals;
   a first impedance network connected between said inverting input terminal and said non-inverting output terminal and having a first input terminal for inputting a first input signal to said inverting input terminal and a first output terminal connected to said non-inverting output terminal;
   a second impedance network connected between said non-inverting input terminal and said inverting output terminal and having a second input terminal for inputting a second input signal to said non-inverting input terminal and a second output terminal connected to said inverting output terminal;
   a third impedance network connected between said first and second impedance networks and including a first capacitor and a second capacitor, each having the same capacitance value, and being oppositely connected in parallel and formed as part of said substrate wherein an upper electrode of said first capacitor is electrically connected to a lower electrode of said second capacitor, and
   a fourth impedance network connected between said first and second impedance networks and including a third capacitor and a fourth capacitor, each having the same capacitance value, and being oppositely connected in parallel and formed as part of said substrate wherein an upper electrode of said third capacitor is electrically connected to a lower electrode of said fourth capacitor,
   wherein said first impedance network is constituted by first and second resistors connected in series between said inverting input terminal and said first input terminal, third and fourth resistors connected in series between said non-inverting output terminal and said inverting input terminal, and a fifth capacitor connected parallelly to a series circuit of the third and fourth resistors, said second impedance network is constituted by fifth and sixth resistors connected in series between said non-inverting input terminal and said second input terminal, seventh and eighth resistors connected in series between said inverting output terminal and said non-inverting input terminal, and a sixth capacitor connected parallelly to a series circuit of said seventh and eighth resistors, said third impedance network is connected between a connection point of said first and second resistors and a connection point of said fifth and sixth resistors, and said fourth impedance network is connected between a connection point of said third and fourth resistors and a connection point of said seventh and eighth resistors.

* * * * *